United States Patent
Taga (10) Patent No.: US 11,655,347 B2
(45) Date of Patent: May 23, 2023

(54) ORGANIC-INORGANIC HYBRID MEMBRANE

(71) Applicants: HYOMEN KAIMEN KOBO CORPORATION, Aichi (JP); RIKEN TECHNOS CORPORATION, Tokyo (JP)

(72) Inventor: Yasunori Taga, Aichi (JP)

(73) Assignees: HYOMEN KAIMEN KOBO CORPORATION, Aichi (JP); RIKEN TECHNOS CORPORATION, Tokyo (JP)

(*) Notice: Subject to any disclaimer, the term of this patent is extended or adjusted under 35 U.S.C. 154(b) by 92 days.

(21) Appl. No.: 16/962,095

(22) PCT Filed: Jan. 16, 2019

(86) PCT No.: PCT/JP2019/001129
§ 371 (c)(1),
(2) Date: Jul. 14, 2020

(87) PCT Pub. No.: WO2019/142830
PCT Pub. Date: Jul. 25, 2019

(65) Prior Publication Data
US 2020/0339772 A1 Oct. 29, 2020

(30) Foreign Application Priority Data

Jan. 18, 2018 (JP) .............................. JP2018-006079

(51) Int. Cl.
| | | |
|---|---|---|
| C03C 17/00 | (2006.01) | |
| C03C 17/42 | (2006.01) | |
| C08F 14/26 | (2006.01) | |
| C08K 3/22 | (2006.01) | |
| C23C 14/34 | (2006.01) | |
| E06B 5/10 | (2006.01) | |
| C08J 5/18 | (2006.01) | |
| B60J 1/02 | (2006.01) | |
| B60J 1/08 | (2006.01) | |
| B60J 1/18 | (2006.01) | |

(52) U.S. Cl.
CPC .............. *C08J 5/18* (2013.01); *C03C 17/007* (2013.01); *C03C 17/42* (2013.01); *C08F 14/26* (2013.01); *C08K 3/22* (2013.01); *C23C 14/3407* (2013.01); *B60J 1/02* (2013.01); *B60J 1/08* (2013.01); *B60J 1/18* (2013.01); *C03C 2217/74* (2013.01); *C03C 2218/154* (2013.01); *C08J 2327/18* (2013.01); *C08K 2003/2213* (2013.01); *E06B 5/10* (2013.01)

(58) Field of Classification Search
None
See application file for complete search history.

(56) References Cited

U.S. PATENT DOCUMENTS

| | | | | |
|---|---|---|---|---|
| 3,518,110 A | * | 6/1970 | Fischbein ............ | C09D 127/12 428/335 |
| 2006/0148971 A1 | * | 7/2006 | Jing ..................... | C09D 127/18 524/520 |
| 2010/0021739 A1 | * | 1/2010 | Aruga ................... | B32B 27/20 428/411.1 |
| 2011/0003130 A1 | * | 1/2011 | Marchet ................ | C09C 1/3684 428/323 |
| 2017/0321070 A1 | * | 11/2017 | Tsukamoto ............ | C09D 7/61 |
| 2018/0004078 A1 | * | 1/2018 | Higuchi ................ | C08K 3/04 |
| 2018/0282548 A1 | * | 10/2018 | Buissette .............. | H10K 77/10 |

FOREIGN PATENT DOCUMENTS

| | | | | |
|---|---|---|---|---|
| CN | 105977515 A | * | 9/2016 | |
| EP | 1319683 A1 | | 6/2003 | |
| GB | 1126012 A | * | 9/1968 | ............ B32B 27/00 |
| JP | H0230528 A | | 1/1990 | |
| JP | H04300644 A | | 10/1992 | |
| JP | H06306591 A | | 11/1994 | |

(Continued)

OTHER PUBLICATIONS

Machine translation of JP 08037942 A, retrieved Sep. 2022 (Year: 2022).*
Machine translation of JP 2007162029 A. retrieved Sep. 2022 (Year: 2022).*
Extended Supplementary Search Report in European Application No. 19740979.0. dated Aug. 19, 2021.
H. Biederman "RF sputtering of polymers and its potential application", Vacuum 59, 2000; pp. 594-599.
Choukourov et al., "RF sputtering of composite SiOx/plasma polymer films and their basic properties", Surface and Coatings Technology, 151-152, 2002; pp. 214-217.

(Continued)

*Primary Examiner* — Nicole M. Buie-Hatcher
(74) *Attorney, Agent, or Firm* — Raphael Bellum PLLC (57) ABSTRACT

In one aspect, the present invention is an organic-inorganic hybrid membrane of a cerium oxide and an organic fluorine compound, the organic-inorganic hybrid membrane satisfying the following (a), (b), and (c): (a) the visible-light transmittance is 70% or higher; (b) the UV transmittance at a wavelength of 380 nm is 60% or lower; and (c) the water contact angle of the surface of the organic-inorganic hybrid membrane is 80° or higher. In another aspect, the present invention is an organic-inorganic hybrid membrane of a cerium oxide and an organic fluorine compound, the organic-inorganic hybrid membrane satisfying the following (a), (b), and (c'): (a) the visible-light transmittance is 70% or higher; (b) the UV transmittance at a wavelength of 380 nm is 60% or lower; and (c') the water contact angle of the surface of the organic-inorganic hybrid membrane is 90° or higher. The organic fluorine compound may include a fluorine-based resin. Also disclosed are a laminate and an article that include the organic-inorganic hybrid membrane.

14 Claims, 2 Drawing Sheets

(56) References Cited

FOREIGN PATENT DOCUMENTS

| JP | H07102207 | A |   | 4/1995 |
| --- | --- | --- | --- | --- |
| JP | H07166324 | A |   | 6/1995 |
| JP | H0837942 | A |   | 2/1996 |
| JP | H10147681 | A |   | 6/1998 |
| JP | 10287784 | A |   | 10/1998 |
| JP | H10292056 | A |   | 11/1998 |
| JP | 2000287559 | A |   | 10/2000 |
| JP | 2007162029 | A | * | 6/2007 |
| JP | 2007301976 | A |   | 11/2007 |
| JP | 2008231304 | A |   | 10/2008 |
| JP | 4224290 | B2 | * | 2/2009 |
| JP | 4294152 | B2 | * | 7/2009 |
| JP | 2014040017 | A |   | 3/2014 |
| JP | 2014043101 | A |   | 3/2014 |
| JP | 2015156377 | A |   | 8/2015 |
| JP | 2016068423 | A |   | 5/2016 |
| WO | 2012090674 | A1 |   | 7/2012 |
| WO | 2016122223 | A1 |   | 8/2016 |
| WO | WO-2016199867 | A1 | * | 12/2016 ............... C08K 3/04 |
| WO | WO-2017050894 | A1 | * | 3/2017 ............ C08F 210/02 |

OTHER PUBLICATIONS

Tomonaga et al., "Novel Functioning of Glass by Wet Coating Process", New Glass, vol. 12, No. 1, 1997, english abstract.

English Translation of International Preliminary Report on Patentability of International Application No. PCT/JP2019/001129, dated Jul. 21, 2020.

* cited by examiner

ORGANIC-INORGANIC HYBRID MEMBRANE

TECHNICAL FIELD

The present invention relates to an organic-inorganic hybrid film. More specifically, the present invention relates to an organic-inorganic hybrid film having a low UV transmittance and a high visible-light transmittance.

BACKGROUND ART

Conventionally, articles including inorganic glass as a substrate have been used for windows and windshields and the like of automobiles, windows and doors and the like of buildings, and protective plates and display face plates and the like of image display devices since the articles have excellent chemical stability, and meet required properties such as transparency, rigidity, scratch resistance, and weather resistance. Meanwhile, the inorganic glass disadvantageously has low impact resistance, to be apt to be broken. Therefore, heretofore, a resin film has been used by being applied to the inorganic glass for the purpose of protecting the inorganic glass from impact or preventing the inorganic glass from scattering when broken.

When a resin film is applied to a building window and the like, it is general to apply the resin film to the indoor side from a viewpoint of weather resistance and stain resistance (or fouling resistance). However, when the resin film is applied to the indoor side, there have been disadvantages that a working space is required indoors, and a sufficient working space cannot be secured, which may cause restricted work, for example. Therefore, a resin film having weather resistance and stain resistance which can be applied to the outdoor side of a window or the like has been required. A resin film used for a window and the like of an automobile has been also required to have weather resistance and stain resistance suitable for the application to the outside of the window from the similar viewpoint, and further from a viewpoint that the resin film can be easily applied to the outside of the window for construction. Furthermore, in recent years, an image display device has been developed for applications used in places which are exposed to direct sunlight such as car navigation and digital signage (in an environment exposed to ultraviolet light). Therefore, a resin film used for the image display device has been also required to have weather resistance and stain resistance which can be developed for such applications.

However, the resin film has poorer weather resistance than that of the inorganic glass. In particular, the resin film has insufficient weather resistance for use in an environment exposed to ultraviolet light (the outdoor side of a building window, the outside of an automobile window, and the like). Therefore, improvement in the weather resistance of the resin film is an urgent issue.

When a resin film is particularly applied to the outdoor side of a building window or the outside of an automobile window or the like, deterioration in transparency due to the adhesion of pollutants (polluted water and an oil film and the like) flying from an external environment, and deterioration in external visibility become major issues. Therefore, as a technique for preventing the adhesion of pollutants to the resin film, the use of a material having low surface energy, for example, a fluorine-based resin as a surface protective layer has been proposed (for example, see Patent Literature 3). However, the abrasion resistance of the fluorine-based resin is insufficient for use in the outdoor side of the building window or the outside of the automobile window.

Glass has disadvantages such as low impact resistance causing breakability, low processability, difficult handling, high specific gravity causing a heavy weight, and difficulty in meeting the demands for a curved article and flexibility. Therefore, materials replacing glass have been actively studied, and a transparent resin laminate has been proposed, in which a hard coat is laminated on a sheet or plate made of a transparent resin such as a polycarbonate resin or an acrylic resin (see, for example, Patent Literatures 4 and 5). However, the weather resistance and the stain resistance, particularly the weather resistance is insufficient for applications used in an environment exposed to ultraviolet light.

CITATION LIST

Patent Literature

PATENT LITERATURE 1: JP2016-068423A
PATENT LITERATURE 2: JP2008-231304A
PATENT LITERATURE 3: JPH2-030528A
PATENT LITERATURE 4: JP2014-043101A
PATENT LITERATURE 5: JP2014-040017A
PATENT LITERATURE 6: JPH6-306591A
PATENT LITERATURE 7: JPH7-166324A

SUMMARY OF INVENTION

Technical Problem

An object of the present invention is to provide a novel organic-inorganic hybrid film. It is another object of the present invention to provide a novel organic-inorganic hybrid film having a low UV transmittance, a high visible-light transmittance, and water-repellent function.

Solution to Problem

Various aspects of the present invention for solving the problems are as follows.

[1]

An organic-inorganic hybrid film of a cerium oxide and an organic fluorine compound, the organic-inorganic hybrid film satisfying the following (a), (b), and (c):

(a) a visible-light transmittance is 70% or higher;

(b) a UV transmittance at a wavelength of 380 nm is 60% or lower; and (c) a water contact angle of a surface of the organic-inorganic hybrid film is 80° or higher.

[2]

An organic-inorganic hybrid film of a cerium oxide and an organic fluorine compound, the organic-inorganic hybrid film satisfying the following (a), (b), and (c'):

(a) a visible-light transmittance is 70% or higher;

(b) a UV transmittance at a wavelength of 380 nm is 60% or lower; and (c') a water contact angle of a surface of the organic-inorganic hybrid film is 90° or higher.

[3]

The organic-inorganic hybrid film according to the above item [1] or [2], wherein the organic fluorine compound contains a fluorine-based resin.

[4]
A laminate comprising the organic-inorganic hybrid film according to any one of the above items [1] to [3].

[5]
An article comprising the organic-inorganic hybrid film according to any one of the above items [1] to [3].

Advantageous Effects of Invention

The organic-inorganic hybrid film of the present invention has a low UV transmittance, a high visible-light transmittance, and water-repellent function (as a result, stain resistance or fouling resistance). Therefore, the organic-inorganic hybrid film of the present invention can be suitably used for an article and the like used in a place receiving direct sunlight such as the outdoor side of a building window and the outside of an automobile window; and a place receiving direct sunlight such as car navigation and digital signage (an environment exposed to ultraviolet light).

DESCRIPTION OF EMBODIMENTS

In the present specification, the term "compound" is used as a term including a mixture containing two or more compounds. The term "resin" is used as a term including a resin mixture containing two or more resins, and a resin composition containing a component(s) other than resins. In the present specification, the term "film" is used as a term including a sheet. Similarly, the term "sheet" is used as a term including a film. In the present specification, the terms "film" and "sheet" are used in those which can be industrially rolled up. The term "plate" is used in those which cannot be industrially rolled up. In the present specification, sequentially laminating one layer and another layer includes both directly laminating the layers and laminating the layers by interposing one or more layers, such as an anchor coat, between the layers.

The term "or more" for a numerical range is used to mean a certain numerical value or a numerical value exceeding the certain numerical value. For example, 20% or more means 20% or a value exceeding 20%. The term "or less" for a numerical range is used to mean a certain numerical value or a numerical value less than the certain numerical value. For example, 20% or less means 20% or a value less than 20%. Furthermore, the symbol "-" for a numerical range is used to mean a certain numerical value, a numerical value greater than the certain numerical value and less than another numerical value, or the other numerical value. Here, the other numerical value is a numerical value greater than the certain numerical value. For example, 10-90% means 10%, greater than 10% and less than 90%, or 90%.

Except for Examples or unless otherwise specified, all numerical values used in the present specification and claims should be understood as being modified by the term "about". Without intending to limit the application of the doctrine of equivalents to the scope of the claims, each numerical value should be interpreted in light of significant figures and by applying ordinary rounding techniques.

1. Organic-Inorganic Hybrid Film

An organic-inorganic hybrid film of the present invention is, in one aspect, an organic-inorganic hybrid film of a cerium oxide and an organic fluorine compound, the organic-inorganic hybrid film satisfying the following (i), (ii), and (iii):
(i) a visible-light transmittance is 70% or higher;
(ii) a UV transmittance at a wavelength of 380 nm is 60% or lower; and
(iii) a water contact angle of a surface of the organic-inorganic hybrid film is 80° or higher.

An organic-inorganic hybrid film of the present invention is, in another aspect, an organic-inorganic hybrid film of a cerium oxide and an organic fluorine compound, the organic-inorganic hybrid film satisfying the following (i), (ii), and (iii'):
(i) a visible-light transmittance is 70% or higher;
(ii) a UV transmittance at a wavelength of 380 nm is 60% or lower; and
(iii') a water contact angle of a surface of the organic-inorganic hybrid film is 90° or higher.

When the UV transmittance at a wavelength of 380 nm is low enough to fall within the above range, improved weather resistance can be obtained. When the water contact angle of the surface of the film is high enough to fall within the above range, improved stain resistance can be obtained.

Here, the "organic-inorganic hybrid film" means a film containing atoms derived from an inorganic compound (including at least atoms derived from a cerium oxide in the present specification), and atoms derived from an organic compound (including at least atoms derived from an organic fluorine compound in the present specification). The organic-inorganic hybrid film usually means a film which contains atoms derived from an inorganic compound (including at least atoms derived from a cerium oxide in the present specification), and atoms derived from an organic compound (including at least atoms derived from an organic fluorine compound in the present specification), and has a low UV transmittance and a high visible-light transmittance. The organic-inorganic hybrid film is typically a film which contains atoms derived from an inorganic compound (including at least atoms derived from a cerium oxide in the present specification), and atoms derived from an organic fluorine compound, and has a low UV transmittance of 60% or lower at a wavelength of 380 nm and a high visible-light transmittance of 70% or higher.

Cerium Oxide

The cerium oxide functions to reduce the UV transmittance of the organic-inorganic hybrid film of the present invention to improve the weather resistance. The cerium oxide functions to improve the abrasion resistance of the organic-inorganic hybrid film.

The cerium oxide used in the production of the organic-inorganic hybrid film of the present invention is not particularly limited, but from a viewpoint of reducing the UV transmittance and increasing the visible-light transmittance, cerium trioxide and cerium dioxide are preferable, and cerium dioxide is more preferable.

As the cerium oxide used in the production of the organic-inorganic hybrid film of the present invention, one or a mixture of two or more thereof can be used.

The cerium oxide used in the production of the organic-inorganic hybrid film may partially or entirely replaced with a cerium compound other than the cerium oxide in the organic-inorganic hybrid film of the present invention.

The oxidation number of the cerium compound in the organic-inorganic hybrid film of the present invention is not particularly limited (may be any of +2, +3, and +4), but it may be preferably +4 from a viewpoint of reducing the UV transmittance and increasing the visible-light transmittance. In the organic-inorganic hybrid film of the present invention, the ratio of a cerium compound having an oxidation number of +4 may be usually, in atomic ratio, 1 at % or more, preferably 10 at % or more, more preferably 30 at % or more, still more preferably 50 at % or more, and most preferably 80 at % or more, when the sum of all cerium compounds is 100 at % (atomic %). In one aspect, the ratio of the cerium compound having an oxidation number of +4 may be 100 at %. In the organic-inorganic hybrid film of the present invention, the ratio of the cerium compound having an oxidation number of +4 is preferably higher.

The kind of a compound formed by cerium in the organic-inorganic hybrid film can be confirmed by X-ray photoelectron spectroscopy (hereinafter sometimes abbreviated as "XPS analysis"). The XPS analysis can be measured using MgKα rays as X-rays (for example, MgKα rays having a beam diameter of 1.1 mm and generated under the conditions of electric power of 400 W and a voltage of 15 kV), for example, using an ESCA5400 type XPS analyzer manufactured by ULVAC-PHI Inc.

Wide scan can be performed, for example, under conditions of an electron extraction angle (hereinafter, sometimes described as a "measurement angle") of 15 or 45°, path energy of 178.95 eV, a measurement range of 0-1100 eV, an energy step of 1.000 eV, a time for one step of 20 ms, and number of measurements of 3. Composition and state analysis data obtained by XPS analysis at a measurement angle of 15° are average values at a depth of 1.3 nm-1.5 nm from a surface, and those obtained by XPS analysis at a measurement angle of 45° are average values at a depth of 4-5 nm from the surface.

Reference: M. P. Seah and W. A. Derch, Surface and Interface Analysis 1, 2 (1979)

Narrow scan can be performed, for example, under conditions of a measurement angle of 15 or 45°, path energy of 178.95 eV, a measurement range of 278-310 eV, an energy step of 0.100 eV, a time for one step of 20 ms, and number of measurements of 10 when the measurement element is C1s. The narrow scan can be performed, for example, under conditions of a measurement angle of 15 or 45°, path energy of 35.75 eV, a measurement range of 523-553 eV, an energy step of 0.100 eV, a time for one step of 20 ms, and number of measurements of 5 when the measurement element is O1s. The narrow scan can be performed, for example, under conditions of a measurement angle of 15° or 45°, path energy of 35.75 eV, a measurement range of 876-926 eV, an energy step of 0.100 eV, a time for one step of 20 ms, and number of measurements of 5 when the measurement element is Ce3d. The narrow scan can be performed, for example, under conditions of a measurement angle of 15 or 45°, path energy of 35.75 eV, a measurement range of 679-709 eV, an energy step of 0.100 eV, a time for one step of 20 ms, and number of measurements of 5 when the measurement element is F1s. The narrow scan can be performed, for example, under conditions of a measurement angle of 15 or 45°, path energy of 35.75 eV, a measurement range of 94-124 eV, an energy step of 0.100 eV, a time for one step of 20 ms, and number of measurements of 5 when the measurement element is Si2p.

Figure 1:
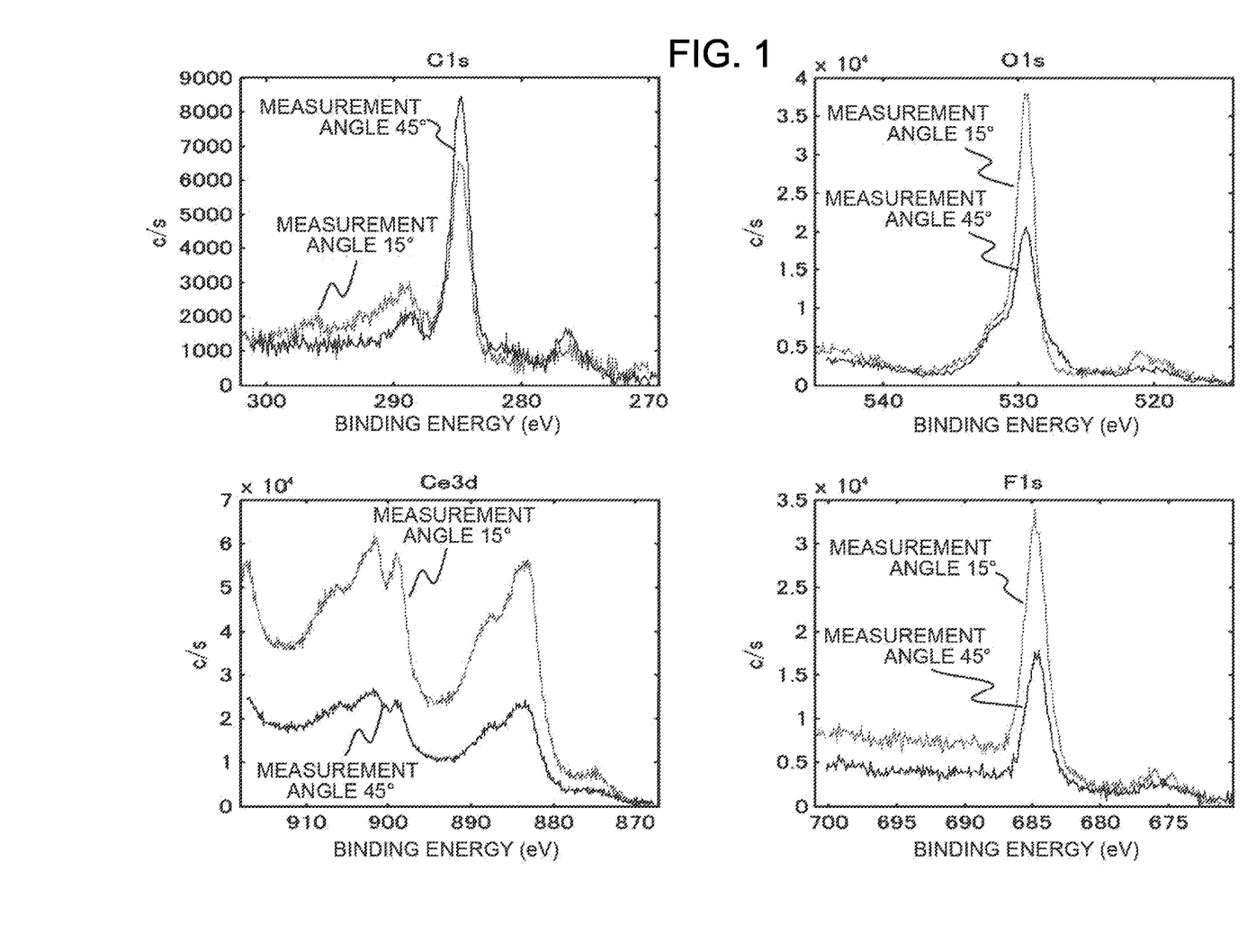
FIG. 1 is a spectrum obtained by XPS analysis of an organic-inorganic hybrid film of Example 4.

FIG. 1 shows a measurement example of XPS analysis. In FIG. 1, an organic-inorganic hybrid film of Example 4, which is a working example to be described later, was measured. It can be seen that a peak derived from cerium dioxide appeared at around 882.5 eV, and a shoulder peak derived from cerium trifluoride appeared at around 884.0 eV where a part of the cerium dioxide was modified to cerium trifluoride, i.e. another compound with a fluorine atom derived from an organic fluorine compound.

Organic Fluorine Compound

The organic fluorine compound is a compound having a fluorine-carbon bond, and is typically a compound having a structure in which one or two or more hydrogen atoms of an organic compound such as a hydrocarbon are substituted with a fluorine atom(s). The organic fluorine compound functions to impart water-repellent function and stain resistance to the organic-inorganic hybrid film of the present invention.

As the organic fluorine compound used for the production of the organic-inorganic hybrid film of the present invention, a fluorine-based resin is preferable from viewpoints of an environmental problem and work safety. The fluorine-based resin is a resin containing a structural unit derived from a monomer containing a fluorine atom (a compound having a fluorine-carbon bond and having polymerizability). The fluorine-based resin can function to impart crack resistance and flexibility in addition to the water-repellent function and the stain resistance to the organic-inorganic hybrid film of the present invention. The fluorine-based resin functions to suppress deterioration in the organic-inorganic hybrid film due to a UV A wave (wavelength: 315-380 nm).

Examples of the fluorine-based resin used for the production of the organic-inorganic hybrid film of the present invention include a resin containing a structural unit derived from a monomer having a structure in which one or two or more hydrogen atoms of an α-olefin are substituted with a fluorine atom(s). Preferred examples of the fluorine-based resin include a resin containing, as one of main monomers, a structural unit derived from a monomer having a structure in which one or two or more hydrogen atoms of an α-olefin are substituted with fluorine atoms (i.e., containing the structural unit in an amount of usually 20 mol % or more, preferably 40 mol % or more, more preferably 60 mol % or more, still more preferably 80 mol % or more, and most preferably 90 mol % or more, when the sum of structural units derived from various monomers is 100 mol %).

Examples of the monomer having a structure in which one or two or more hydrogen atoms of an α-olefin are substituted with a fluorine atom(s) include tetrafluoroethylene, trifluoroethylene, vinylidene fluoride, vinyl fluoride, hexafluoropropylene, pentafluoropropylene, tetrafluoropropylene, trifluoropropylene, and chlorotrifluoroethylene. As the monomer having a structure in which one or two or more hydrogen atoms of an α-olefin are substituted with a fluorine atom(s), one or a mixture of two or more thereof can be used.

Examples of the fluorine-based resin used for the production of the organic-inorganic hybrid film of the present invention include polytetrafluoroethylene, polyhexafluoropropylene, polyvinylidene fluoride, polyvinyl fluoride, a tetrafluoroethylene-hexafluoropropylene copolymer, a tetrafluoroethylene-ethylene copolymer, a tetrafluoroethylene-perfluoroalkylvinyl ether copolymer, a chlorotrifluoroethylene-ethylene copolymer, and polychlorotrifluoroethylene. Among these, polytetrafluoroethylene and polyvinylidene fluoride are preferable from viewpoints of weather resistance, stain resistance, transparency, abrasion resistance, crack resistance, and flexibility. As the fluorine-based resin, one or a mixture of two or more thereof can be used.

From a viewpoint of the weather resistance of the organic-inorganic hybrid film, the ratio of the atoms derived from the cerium oxide in the organic-inorganic hybrid film of the present invention may be, in an atomic ratio, usually 60 at % or more, preferably 70 at % or more, more preferably 75 at % or more, still more preferably 80 at % or more, and most preferably 82 at % or more, when the sum of the atoms derived from the cerium oxide and the atoms derived from the organic fluorine compound is 100 at %; the cerium oxide is cerium dioxide; and the organic fluorine compound is polytetrafluoroethylene (a homopolymer of tetrafluoroethylene). Meanwhile, from viewpoints of the stain resistance, crack resistance, and flexibility of the organic-inorganic hybrid film, the ratio may be usually 99.9 at % or less, preferably 99.5% or less, more preferably 99 at % or less, still more preferably 98 at % or less, and most preferably 97 at % or less. In one aspect, the ratio may be usually 60 at % or more and 99.9 at % or less, preferably 60 at % or more and 99.5% or less, 60 at % or more and 99 at % or less, 60 at % or more and 98 at % or less, 60 at % or more and 97 at % or less, 70 at % or more and 99.9 at % or less, 70 at % or more and 99.5% or less, 70 at % or more and 99 at % or less, 70 at % or more and 98 at % or less, 70 at % or more and 97 at % or less, 75 at % or more and 99.9 at % or less, 75 at % or more and 99.5% or less, 75 at % or more and 99 at % or less, 75 at % or more and 98 at % or less, 75 at % or more and 97 at % or less, 80 at % or more and 99.9 at % or less, 80 at % or more and 99.5% or less, 80 at % or more and 99 at % or less, 80 at % or more and 98 at % or less, 80 at % or more and 97 at % or less, 82 at % or more and 99.9 at % or less, 82 at % or more and 99.5% or less, 82 at % or more and 99 at % or less, 82 at % or more and 98 at % or less, or 82 at % or more and 97 at % or less.

The preferred ratio of the atoms derived from the cerium oxide also depends on the types and combinations of the cerium oxide and organic fluorine compound used for the production of the organic-inorganic hybrid film of the present invention.

In the present specification, the atomic ratio is a value determined by energy dispersive X-ray analysis (hereinafter sometimes abbreviated as "EDX analysis"). The EDX analysis can be performed under conditions of an acceleration voltage of 9 kV, an emission current of 15 µA, a focal length of 15 mm, and a magnification ratio of 600 times, for example, using an apparatus with an EDX analyzer attached to a scanning electron microscope (hereinafter sometimes abbreviated as "SEM"). Examples of the apparatus with an EDX analyzer attached to a scanning electron microscope include an apparatus in which an EMAX ENERGY type EDX analyzer manufactured by Horiba, Ltd. is attached to an S-4300 type SEM manufactured by Hitachi, Ltd.

In Examples to be described later, the EDX analysis was performed using such conditions and apparatuses.

The thickness of the organic-inorganic hybrid film of the present invention is not particularly limited, but from a viewpoint of reducing the UV transmittance of the organic-inorganic hybrid film, it may be usually 1 nm or more, preferably 10 nm or more, more preferably 20 nm or more, still more preferably 30 nm or more, and most preferably 40 nm or more. Meanwhile, from a viewpoint of the crack resistance of the organic-inorganic hybrid film, the thickness of the organic-inorganic hybrid film of the present invention may be usually 1 µm or less, preferably 500 nm or less, more preferably 200 nm or less, still more preferably 100 nm or less, and most preferably 50 nm or less. In one aspect, the thickness of the organic-inorganic hybrid film may be usually 1 nm or more and 1 µm or less, and preferably 1 nm or more and 500 nm or less, 1 nm or more and 200 nm or less, 1 nm or more and 100 nm or less, 1 nm or more and 50 nm or less, 10 nm or more and 1 µm or less, 10 nm or more and 500 nm or less, 10 nm or more and 200 nm or less, 10 nm or more and 100 nm or less, 10 nm or more and 50 nm or less, 20 nm or more and 1 µm or less, 20 nm or more and 500 nm or less, 20 nm or more and 200 nm or less, 20 nm or more and 100 nm or less, 20 nm or more and 50 nm or less, 30 nm or more and 1 µm or less, 30 nm or more and 500 nm or less, 30 nm or more and 200 nm or less, 30 nm or more and 100 nm or less, 30 nm or more and 50 nm or less, 40 nm or more and 1 µm or less, 40 nm or more and 500 nm or less, 40 nm or more and 200 nm or less, 40 nm or more and 100 nm or less, or 40 nm or more and 50 nm or less.

The organic-inorganic hybrid film of the present invention has a visible-light transmittance of usually 70% or higher, preferably 75% or higher, more preferably 80% or higher, still more preferably 85% or higher, and most preferably 90% or higher. The visible-light transmittance is preferably higher. Here, the visible-light transmittance is a ratio of an area obtained by integrating a transmittance spectrum in the range of a wavelength of 400-780 nm to an area obtained by integrating a transmittance spectrum when a transmittance is assumed to be 100% in the entire range of a wavelength of 400-780 nm in the range of a wavelength of 400-780 nm. The visible-light transmittance can be measured, for example, using a spectrophotometer "SolidSpec-3700" (trade name) manufactured by Shimadzu Corporation in accordance with 6.4 visible-light transmittance test of JIS A5759:2016.

The organic-inorganic hybrid film of the present invention has a UV transmittance at a wavelength of 380 nm of usually 60% or lower, preferably 50% or lower, more preferably 40% or lower, still more preferably 30% or lower, yet still more preferably 20% or lower, and most preferably 10% or lower. The UV transmittance at a wavelength of 380 nm is preferably lower. Here, the UV transmittance at a wavelength of 380 nm is a ratio of transmitted light intensity at a wavelength of 380 nm to transmitted light intensity when a transmittance at a wavelength of 380 nm is assumed to be 100%. The UV transmittance at a wavelength of 380 nm can be measured using, for example, a spectrophotometer "SolidSpec-3700" (trade name) manufactured by Shimadzu Corporation in accordance with 6.7 UV transmittance test of JIS A5759:2016.

The organic-inorganic hybrid film of the present invention may have a UV transmittance of usually 30% or lower, preferably 20% or lower, more preferably 10% or lower, still more preferably 5% or lower, and most preferably 1% or lower ("UV" referred to without specifying a wavelength in the context of the present invention means UV at a wavelength of 300-380 nm). The UV transmittance is preferably lower. Here, the UV transmittance is a ratio of an area obtained by integrating a transmittance spectrum in the range of a wavelength of 300-380 nm to an area obtained by integrating a transmittance spectrum when a transmittance is assumed to be 100% in the entire range of a wavelength of 300-380 nm in the range of a wavelength of 300-380 nm. The UV transmittance can be measured, for example, using a spectrophotometer "SolidSpec-3700" (trade name) manufactured by Shimadzu Corporation in accordance with 6.7 UV transmittance test of JIS A5759:2008.

The organic-inorganic hybrid film of the present invention has a surface having a water contact angle of usually 80° or higher, and preferably 85° or higher. In consideration of the Wenzel's equation, water repellency can be further improved by forming fine irregularities in the surface of the organic-inorganic hybrid film of the present invention, so that the water contact angle of the surface may be more preferably 90° or higher, still more preferably 95° or higher, and most preferably 100° or higher. From a viewpoint of the stain resistance of the organic-inorganic hybrid film, the water contact angle is preferably higher. The water contact angle can be measured, for example, by a method in which the water contact angle is calculated from the width and height of a water droplet using an automatic contact angle meter "DSA20" (trade name) manufactured by KRUSS GmbH (see JIS R3257:1999).

The organic-inorganic hybrid film of the present invention may have a visible-light transmittance of 70% or more, 75% or higher, 80% or higher, 85% or higher, or 90% or higher, a UV transmittance at a wavelength of 380 nm of 60% or lower, 50% or lower, 40% or lower, 30% or lower, 20% or lower, or 10% or lower, and a surface having a water contact angle of 80° or higher, 85° or higher, 90° or higher, 95° or higher, or 100° or higher.

2. Laminate

A laminate of the present invention includes the organic-inorganic hybrid film of the present invention. The laminate of the present invention is usually a laminate in which the organic-inorganic hybrid film of the present invention is formed on at least one surface of any substrate.

The substrate is usually a film, a sheet, or a plate. The substrate is preferably transparent from a viewpoint of utilizing the height of the visible-light transmittance of the organic-inorganic hybrid film of the present invention, but it is not limited thereto, and may be opaque. The substrate may be colored and transparent, or colored and opaque.

From a viewpoint of utilizing the height of the visible-light transmittance of the organic-inorganic hybrid film of the present invention, the visible-light transmittance of the substrate may be usually 80% or higher, preferably 85% or higher, more preferably 88% or higher, still more preferably 90% or higher, and most preferably 92% or higher. The visible-light transmittance is preferably higher. Here, the visible-light transmittance is a ratio of an area obtained by integrating a transmittance spectrum in the range of a wavelength of 400-780 nm to an area obtained by integrating a transmittance spectrum when a transmittance is assumed to be 100% in the entire range of a wavelength of 400-780 nm in the range of a wavelength of 400-780 nm. The visible-light transmittance can be measured, for example, using a spectrophotometer "SolidSpec-3700" (trade name) manufactured by Shimadzu Corporation in accordance with 6.4 visible-light transmittance test of JIS A5759:2008.

Examples of the substrate include, but are not particularly limited to, an inorganic glass film, inorganic glass sheet, or inorganic glass plate composed of soda lime glass, borosilicate glass, and quartz glass and the like.

Examples of the substrate include, but are not particularly limited to, resin films, resin sheets, or resin plates composed of cellulose ester resins such as triacetylcellulose; polyester resins such as polyethylene terephthalate; cyclic hydrocarbon resins such as an ethylene norbornene copolymer; acrylic resins such as polymethyl methacrylate, polyethyl methacrylate, and a vinylcyclohexane-methyl (meth)acrylate copolymer; aromatic polycarbonate resins; polyolefin resins such as polypropylene and 4-methyl-pentene-1; polyamide resins; polyarylate resins; polymer-type urethane acrylate resins; and polyimide resins. These resin films include an unstretched film, a uniaxially stretched film, and a biaxially stretched film. The resin films include a laminated resin film obtained by laminating two or more of one or two or more kinds of resin films. These resin sheets include an unstretched sheet, a uniaxially stretched sheet, or a biaxially stretched sheet. These resin sheets include a laminated resin sheet obtained by laminating two or more of one or two or more kinds of resin sheets. These resin plates include a laminated resin plate obtained by laminating two or more of one or two or more kinds of resin plates.

The substrate is not particularly limited, and examples thereof include a laminate of the above-mentioned inorganic glass film, inorganic glass sheet, or inorganic glass plate, and the above-mentioned resin film, resin sheet, or resin plate.

When the inorganic glass is used as the substrate, the thickness of the inorganic glass film, inorganic glass sheet, or inorganic glass plate is not particularly limited, and it may be controlled to any thickness, if desired. The thickness of the inorganic glass as the substrate may be usually 20 µm or more, and preferably 50 µm or more from a viewpoint of the handleability of the laminate of the present invention. The thickness of the inorganic glass as the substrate may be preferably 1 mm or more, and more preferably 1.5 mm or more from a viewpoint of the impact resistance of the inorganic glass. The thickness of the inorganic glass as the substrate may be usually 6 mm or less, preferably 4.5 mm or less, and more preferably 3 mm or less from a viewpoint of reducing the weight of an article using the laminate of the present invention.

When the resin is used as the substrate, the thickness of the resin film, resin sheet, or resin plate is not particularly limited, and it may be controlled to any thickness, if desired. The thickness of the resin as the substrate may be usually 20 µm or more, and preferably 50 µm or more from a viewpoint of the handleability of the laminate of the present invention. When the laminate of the present invention is used for applications which do not require high rigidity, the thickness of the resin as the substrate may be usually 250 µm or less, and preferably 150 µm or less from a viewpoint of economic performance. When the laminate of the present invention is used for applications which require high rigidity, the thickness of the resin as the substrate may be usually 300 µm or more, preferably 500 µm or more, and more preferably 600 µm or more from a viewpoint of maintaining the rigidity. The thickness of the resin as the substrate may be usually 1500 µm or less, preferably 1200 µm or less, and more preferably 1000 µm or less from a viewpoint of meeting the demand for reducing the thickness of an article using the laminate of the present invention.

The laminate of the present invention may have a visible-light transmittance of usually 70% or higher, preferably 75% or higher, more preferably 80% or higher, still more preferably 85% or higher, and most preferably 90% or higher. The visible-light transmittance is preferably higher. Here, the visible-light transmittance is a ratio of an area obtained by integrating a transmittance spectrum in the range of a wavelength of 400-780 nm to an area obtained by integrating a transmittance spectrum when a transmittance is assumed to be 100% in the entire range of a wavelength of 400-780 nm in the range of a wavelength of 400-780 nm. The visible-light transmittance can be measured using a spectrophotometer "SolidSpec-3700" (trade name) manufactured by Shimadzu Corporation in accordance with 6.4 visible-light transmittance test of JIS A5759:2008, for example.

The laminate of the present invention may have a UV transmittance at a wavelength of 380 nm of usually 60% or lower, preferably 50% or lower, more preferably 40% or lower, still more preferably 30% or lower, yet still more preferably 20% or lower, and most preferably 10% or lower. The UV transmittance at a wavelength of 380 nm is preferably lower. Here, the UV transmittance at a wavelength of 380 nm is a ratio of transmitted light intensity at a wavelength of 380 nm to transmitted light intensity when a transmittance at a wavelength of 380 nm is assumed to be 100%. The UV transmittance at a wavelength of 380 nm can be determined by reading a transmittance at a wavelength of 380 nm from a transmittance spectrum measured using a spectrophotometer "SolidSpec-3700" (trade name) manufactured by Shimadzu Corporation in accordance with 6.7 UV transmittance test of JIS A5759:2008, for example.

The organic-inorganic hybrid film of the present invention may have a surface indentation hardness of usually 100 $N/mm^2$ or more, preferably 200 $N/mm^2$ or more, more preferably 300 $N/mm^2$ or more, and still more preferably 400 $N/mm^2$ or more. From a viewpoint of the abrasion resistance of the organic-inorganic hybrid film, the indentation hardness is preferably higher. The indentation hardness can be measured under the conditions of a maximum load of 0.1 mN, a load increasing rate of 0.1 mN/20 seconds, a holding time of 5 seconds, and an unloading rate of 0.1 mN/20 seconds with a Berkovich indenter (for example, a Berkovich diamond indenter (model number: HB) manufactured by TECDIA Co., Ltd., or the like can be used) using a surface micro hardness tester "PICODENTER HM500" (trade name) manufactured by Fischer Instruments Co., Ltd., for example.

The laminate of the present invention may have a UV transmittance of usually 30% or lower, preferably 20% or lower, more preferably 10% or lower, still more preferably 5% or lower, and most preferably 1% or lower (the term "UV" which is referred to herein without specifying a wavelength in the context of the present invention means UV rays at a wavelength of 300-380 nm). The UV transmittance is preferably lower. Here, the UV transmittance is a ratio of an area obtained by integrating a transmittance spectrum in the range of a wavelength of 300-380 nm to an area obtained by integrating a transmittance spectrum when a transmittance is assumed to be 100% in the entire range of a wavelength of 300-380 nm in the range of a wavelength of 300-380 nm. The UV transmittance can be measured using a spectrophotometer "SolidSpec-3700" (trade name) manufactured by Shimadzu Corporation in accordance with 6.7 UV transmittance test of JIS A5759:2008, for example.

The laminate including the organic-inorganic hybrid film of the present invention may have a visible-light transmittance of 70% or higher, 75% or higher, 80% or higher, 85% or higher, or 90% or higher, and a UV transmittance at a wavelength of 380 nm of 60% or lower, 50% or lower, 40% or lower, 30% or lower, 20% or lower, or 10% or lower, and the water contact angle of the surface of the organic-inorganic hybrid film may be 80° or higher, 85° or higher, 90° or higher, 95° or higher, or 100° or higher.

3. Article

An article of the present invention includes the organic-inorganic hybrid film of the present invention. The organic-inorganic hybrid film of the present invention is usually formed on the surface of the article of the present invention. Typically, the organic-inorganic hybrid film is formed on the surface of the article of the present invention, particularly on a portion thereof exposed to direct sunlight, to impart weather resistance and stain resistance to the article of the present invention.

The article of the present invention is not particularly limited except that it contains the organic-inorganic hybrid film of the present invention. Examples of the article of the present invention include windows and windshields of automobiles; windows and doors and the like of buildings; protective plates and display face plates and the like of image display devices; solar cells, and members such as housings and front plates thereof, and members used for these articles (for example, hard coat laminated films and transparent resin laminates and the like).

4. Production Method of Organic-Inorganic Hybrid Film

The organic-inorganic hybrid film of the present invention is produced using a cerium oxide and an organic fluorine compound. The organic-inorganic hybrid film of the present invention can be produced using a cerium oxide and an organic fluorine compound according to any method, for example, sputtering methods such as a bipolar sputtering method, a magnetron sputtering method, and a reactive sputtering method; vacuum evaporation methods; ion plating methods; chemical vapor deposition methods such as a low temperature plasma chemical vapor deposition method, a plasma chemical vapor deposition method, a thermal chemical vapor deposition method, and a photochemical vapor deposition method; liquid phase methods such as a sol-gel method, an electrolytic method, and an emulsion method, and combinations thereof. The production method is not limited to the means listed here.

Here, the cerium oxide may be a cerium oxide itself, may be a mixture, composition, or compound containing a cerium oxide, or may be in the form of a solution, sol, gel, or solid containing a cerium oxide. Here, the organic fluorine compound may be an organic fluorine compound itself, a mixture or composition containing an organic fluorine compound, or may be in the form of a solution, sol, gel, or solid containing these.

In the case where the organic-inorganic hybrid film of the present invention is produced by a sputtering method, an example in which cerium dioxide is used as a cerium oxide and polytetrafluoroethylene (a homopolymer of tetrafluoroethylene) is used as an organic fluorine compound will be described later.

Figure 2:
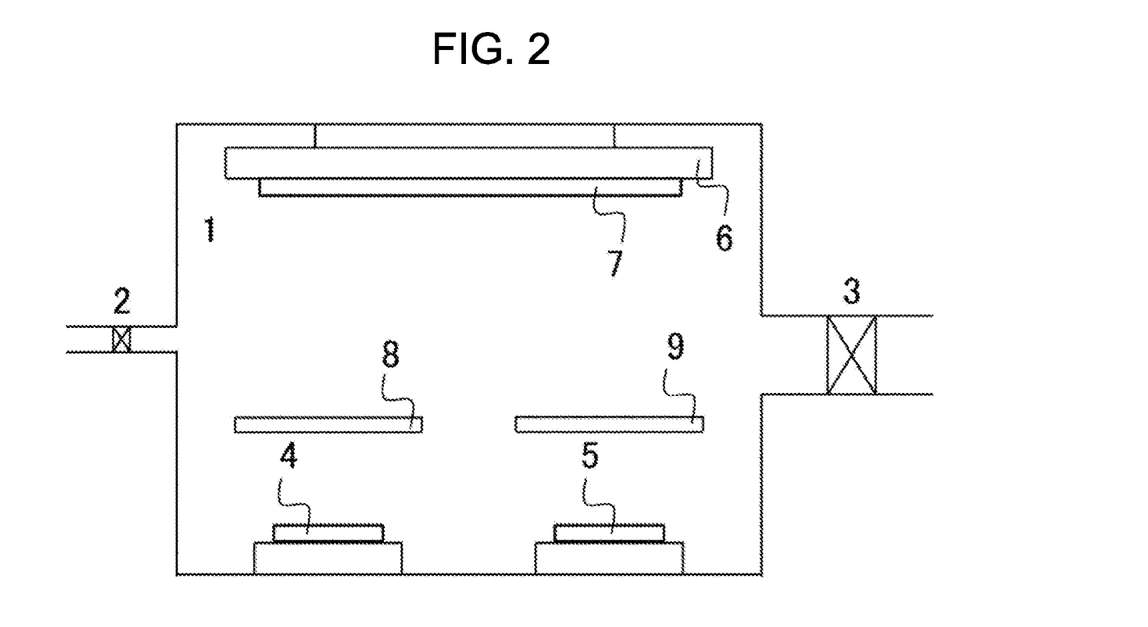
FIG. 2 is a conceptual diagram showing an example of a bipolar sputtering apparatus.

A sputtering apparatus is not particularly limited, and any known sputtering apparatus can be used. FIG. 2 is a conceptual diagram showing an example of a sputtering apparatus capable of performing bipolar sputtering. The apparatus in FIG. 2 includes a sputtering chamber 1 including a sputtering gas introduction port 2 and an exhaust port 3.

The sputtering chamber 1 can introduce a sputter gas from the sputtering gas introduction port 2.

The sputtering chamber 1 is exhausted from an exhaust port 3 by an exhauster (not shown), whereby the sputtering chamber 1 can be maintained at a predetermined pressure. The exhauster is not particularly limited as long as it has an ability to maintain the predetermined pressure. Examples of the exhauster include rotary pumps such as a gear pump, a vane pump, and a screw pump; cryopumps; and combinations thereof.

In a lower part of the sputtering chamber 1, a cerium dioxide target 4 and a polytetrafluoroethylene target 5 are provided. The targets 4 and 5 are connected to different impedance matching apparatuses (not shown) and high-frequency power supplies (not shown), respectively, in order that the composition of the organic-inorganic hybrid film (the ratio of atoms derived from cerium dioxide to atoms derived from polytetrafluoroethylene) can be appropriately adjusted, whereby the electric power supplied to the target can be individually controlled.

A sputtering table 6 is disposed at a position facing the targets 4 and 5 in the upper part of the sputtering chamber 1, and a substrate 7 is placed on the sputtering table 6. The sputtering table 6 is rotatable at a predetermined rotation speed. A shutter 8 is provided between the target 4 and the substrate 7, and a shutter 9 is provided between the target 5 and the substrate 7. Support rods and the like of the shutters 8 and 9 are not shown.

The distance between each of the targets 4 and 5 and the substrate 7 is not particularly limited, but it may be usually about 1-10 cm, and preferably about 3-7 cm.

A method for producing the organic-inorganic hybrid film of the present invention according to a bipolar sputtering method will be described with reference to FIG. 2. First, a cerium dioxide target 4 and a polytetrafluoroethylene target 5 are placed in a sputtering apparatus.

As the cerium dioxide target 4, a sintered body obtained by sintering cerium dioxide in advance is preferably used from a viewpoint of handleability. The shape of the sintered body as the target 4 is not particularly limited, and can be appropriately selected depending on the specifications of the sputtering apparatus to be used. The shape of the sintered body may be, for example, a disk shape having a diameter of usually 10-200 mm, and preferably 20-100 mm, and a thickness of usually 1-20 mm, and preferably 2-10 mm.

As the polytetrafluoroethylene target 5, a molded body obtained by molding polytetrafluoroethylene in advance according to a method such as injection molding is preferably used from a viewpoint of handleability. The shape of the molded body as the target 5 is not particularly limited, and can be appropriately selected depending on the specifications of the sputtering apparatus to be used. The shape of the molded body may be, for example, a disk shape having a diameter of usually 10-200 mm, and preferably 20-100 mm, and a thickness of usually 1-20 mm, and preferably 2-10 mm.

Next, a substrate 7 is placed on a sputtering table 6, to rotate the sputtering table 6 at a predetermined rotation speed. The predetermined rotation speed of the sputtering table 6 may be usually 1-1000 rotations/minute (rpm), and preferably 2-50 rotations/minute. During the formation of the organic-inorganic hybrid film, the rotation speed may be constant, or the rotation speed may be changed if desired. As the substrate 7, for example, those mentioned above in the description of the laminate of the present invention can be used.

Next, a sputtering chamber 1 is evacuated from an exhaust port 3 by an exhauster so that the pressure can be made be lower than or equal to a predetermined pressure of the sputtering chamber 1 during film formation. The predetermined pressure may be usually about $10^{-3}$-$10^{-5}$ Pa, and preferably about $10^4$ Pa.

Next, a sputter gas is introduced into the sputtering chamber 1 from a sputtering gas introduction port 2 so that the sputtering chamber 1 can have the predetermined pressure during film formation.

Examples of the sputtering gas include an inert gas such as argon or krypton, and a mixed gas of the inert gas and oxygen or nitrogen. Among them, from a viewpoint of reducing the UV transmittance of the organic-inorganic hybrid film and increasing the visible-light transmittance, argon, and a mixed gas of argon and oxygen are preferable, and a mixed gas of argon and oxygen is more preferable. By using the mixed gas of argon and oxygen, the ratio of cerium having an oxidation number of +4 in the organic-inorganic hybrid film can be increased, whereby the UV transmittance can be reduced.

When the mixed gas of argon and oxygen is used as the sputtering gas, the volume flow rate of the oxygen gas may be usually 1-20%, and preferably 2-10%, with the volume flow rate of the argon gas being 100%.

The predetermined pressure in the sputtering chamber 1 during film formation may be usually 0.5-5 Pa, and preferably 0.5-1 Pa from a viewpoint of stabilizing discharge to allow continuous film formation.

Subsequently, predetermined electric power (usually, high-frequency electric power) is applied to the cerium dioxide target 4 and the polytetrafluoroethylene target 5, to cause discharge. When the discharge state is stabilized, shutters 8 and 9 are opened, and each target is sputtered to form an organic-inorganic hybrid film on the substrate 7.

The composition of the organic-inorganic hybrid film (a ratio of atoms derived from cerium dioxide to atoms derived from polytetrafluoroethylene) is determined by controlling the electric power applied to each of the targets. The relationship between the applied electric energy and the film formation rate shall be determined for each of cerium dioxide and polytetrafluoroethylene by performing a preliminary experiment in advance.

When an apparatus for unipolar sputtering is used, a mixture of cerium dioxide and polytetrafluoroethylene may be used as a target. In this case, the composition of the organic-inorganic hybrid film can be controlled by the blending ratio of the mixture. The relationship between the blending ratio of the mixture and the composition of the organic-inorganic hybrid film shall be determined by performing a preliminary experiment in advance.

Even when the organic-inorganic hybrid film is formed by any of methods such as a sputtering method, a chemical vapor deposition method, and a liquid phase method, an annealing treatment is preferably performed at a temperature which is 50° C. or higher, preferably 80° C. or higher, and more preferably 100° C. or higher, and is equal to or lower than a temperature provided in consideration of the heat resistance of the substrate, and preferably 150° C. or lower from viewpoints of workability and productivity, after the organic-inorganic hybrid film is formed. Thereby, the properties of the organic-inorganic hybrid film can be stabilized. The water-repellent function of the organic-inorganic hybrid film can be improved.

EXAMPLES

Hereinafter, the present invention will be described with reference to Examples, but the present invention is not limited thereto.

Method for Measuring and Evaluating Physical Properties of Laminate Including Organic-Inorganic Hybrid Film (i) Visible-Light Transmittance A visible-light transmittance was measured using a spectrophotometer "SolidSpec-3700" (trade name) manufactured by Shimadzu Corporation in accordance with 6.4 visible-light transmittance test in JIS A5759:2008.

(ii) UV Transmittance 1 (UV Transmittance at Wavelength of 380 nm):

A transmittance at a wavelength of 380 nm was read from a transmittance spectrum measured using a spectrophotometer "SolidSpec-3700" (trade name) manufactured by Shimadzu Corporation in accordance with 6.7 UV transmittance test in JIS A5759:2008. The value was taken as a UV transmittance 1.

(iii) Water Contact Angle

The water contact angle of an organic-inorganic hybrid film surface of a laminate was measured with an automatic contact angle meter "DSA 20" (trade name) manufactured by KRUSS GmbH by using a method to calculate from the width and height of a water drop (see JIS R3257:1999).

(iv) UV transmittance 2 (UV Transmittance at a wavelength range of from 300 nm to 380 nm)

A transmittance measured using a spectrophotometer "SolidSpec-3700" (trade name) manufactured by Shimadzu Corporation in accordance with 6.7 UV transmittance test in JIS A5759:2008 was taken as a UV transmittance 2.
(v) Hardness (Indentation Hardness)
A hardness was measured under the conditions of a maximum load of 0.1 mN, a load increasing rate of 0.1 mN/20 seconds, a holding time of 5 seconds, and a load removing rate of 0.1 mN/20 seconds with a Berkovich diamond indenter (model number: HB) manufactured by TECDIA Co., Ltd. using a surface micro hardness tester "PICODENTER HM500" (trade name) manufactured by Fischer Instruments Co., Ltd.

Raw Materials Used
(A) Cerium Oxide
(A-1) A disk obtained by sintering cerium dioxide, having a diameter of 76.2 mm and a thickness of 5 mm, and manufactured by Kojundo Chemical Lab. Co., Ltd.
(B) Organic Fluorine Compound
(B-1) A disk made of polytetrafluoroethylene (a homopolymer of tetrafluoroethylene) having a diameter of 76.2 mm and a thickness of 5 mm, and manufactured by Kojundo Chemical Lab. Co., Ltd.
(C) Substrate
(C-1) An inorganic glass substrate "Eagle XG" (trade name) manufactured by Corning Incorporated. The substrate had a thickness of 0.7 mm, a UV transmittance of 94% at a wavelength of 380 nm, a visible-light transmittance of 91%, a UV transmittance of 93% at a wavelength range of from 300 nm to 380 nm, and a yellowness index of 0.5.

Example 1

(1) The (C-1) was subjected to a surface treatment under the conditions of applied electric power of 180 W, scan number of 0.5 reciprocation, a scan speed of 20 mm/sec, and a distance of 2 mm between an electrode and a surface to be treated with an argon gas containing 0.5% by volume of oxygen ($O_2$) (argon gas at a volume flow rate of 6 liters/min. and oxygen ($O_2$) at a volume flow rate of 30 ml/min. were used) as a discharge gas using an atmospheric pressure plasma processing apparatus "MyPL Auto200" (trade name) manufactured by APP Co. Ltd.

(2) Next, simultaneous sputtering film formation was performed under the conditions of a film forming pressure of 1 Pa, 100% by volume of an argon gas as an introduced gas (expressed as "Ar" in Table), a volume flow rate of 10 sccm of an introduced gas, a distance of 5 cm between the (C-1) and each target, and applied electric powers (frequency: 13.56 MHz) of 540 W on the (A-1) side and 1.3 W on the (B-1) side with the (A-1) and (B-1) as targets using a bipolar sputtering apparatus manufactured by VIC International Co., Ltd. Incidentally, in a preliminary experiment, the film formation rate at applied electric power of 200 W for the (A-1) was 4.7 nm/min., and the film formation rate at applied electric power of 100 W for the (B-1) was 5.0 nm/min.

(3) Subsequently, an annealing treatment was performed at a temperature of 100° C. for 1 hour to obtain a laminate in which an organic-inorganic hybrid film was formed on the (C-1).

(4) The organic-inorganic hybrid film of the laminate obtained in the step (3) was subjected to EDX analysis to confirm the composition of the film. The EDX analysis was performed under the conditions of an accelerating voltage of 9 kV, an emission current of 15 μA, a focal distance of 15 mm, and a magnification ratio of 600 times using an apparatus in which an EMAX ENERGY type EDX analyzer of HORIBA, Ltd. was attached to an S-4300 type SEM manufactured by Hitachi, Ltd. Furthermore, the tests (i)-(v) were performed. The results are shown in Table 1.

Examples 2-7

Laminates each including an organic-inorganic hybrid film were produced, and the physical properties of the laminates were measured and evaluated in the same manner as in Example 1 except that applied electric power during film formation was changed as shown in Table 1. The results are shown in Table 1.

TABLE 1

|  |  | Ex. 1 | Ex. 2 | Ex. 3 | Ex. 4 | Ex. 5 | Ex. 6 | Ex. 7 |
|---|---|---|---|---|---|---|---|---|
| Film formation conditions | Cerium oxide | A-1 | A-1 | A-1 | A-1 | A-1 | A-1 | A-1 |
|  | Applied electric power on cerium oxide side (W) | 540 | 500 | 300 | 180 | 130 | 100 | 42 |
|  | Fluorine-based resin | B-1 | B-1 | B-1 | B-1 | B-1 | B-1 | B-1 |
|  | Applied electric power on fluorine-based resin side (W) | 1.3 | 12 | 15 | 15 | 15 | 20 | 20 |
|  | Introduced gas | Ar | Ar | Ar | Ar | Ar | Ar | Ar |
|  | Substrate | C-1 | C-1 | C-1 | C-1 | C-1 | C-1 | C-1 |
| Composition | Derived from A-1 (at %) | 99.5 | 95 | 90 | 85 | 80 | 70 | 50 |
|  | Derived from B-1 (at %) | 0.5 | 5 | 10 | 15 | 20 | 30 | 50 |
| Film thickness (nm) |  | 100 | 100 | 100 | 100 | 100 | 100 | 100 |
| Evaluation results | Visible-light transmittance (%) | 81 | 82 | 80 | 81 | 81 | 82 | 81 |
|  | UV transmittance 1 (%) | 42 | 45 | 46 | 47 | 48 | 54 | 90 |
|  | Water contact angle (deg) | 96 | 96 | 96 | 97 | 98 | 98 | 99 |
|  | UV transmittance 2 (%) | 21 | 22 | 24 | 26 | 31 | 37 | 58 |
|  | Hardness (KN/mm$^2$) | 20.5 | 18.8 | 16.7 | 15.2 | 13.5 | 10.7 | 8.1 |

From these results, it was demonstrated that the organic-inorganic hybrid film of the present invention having a low UV transmittance and a high visible-light transmittance is obtained. The organic-inorganic hybrid film of the present invention had water-repellent function.

In each of these Examples, the laminate including the organic-inorganic hybrid film of the present invention was obtained using the glass plate as the substrate. However, because the organic-inorganic hybrid film of the present invention has a low UV transmittance, a high visible-light transmittance, and water-repellent function, those skilled in the art will readily understand that, even when the laminate including the film is produced using a resin film, a resin sheet, or a resin plate as the substrate, the weather resistance and stain resistance of the resin film and the like can be largely improved in a similar manner to the above examples using the glass substrate. Moreover, because the hardness of the organic-inorganic hybrid film of the present invention is higher than that of the glass plate as the substrate (the (v) hardness value of the (C-1) was measured as 6.4 KN/mm$^2$), those skilled in the art will readily understand that, even when the laminate is produced by forming the organic-inorganic hybrid film of the present invention on the surface of a resin film, a resin sheet, or a resin plate, the surface hardness of the resin film and the like, and eventually the abrasion resistance can be largely improved in a similar manner to the above examples using the glass substrate.

Example 8

A laminate including an organic-inorganic hybrid film was produced, and the physical properties of the laminate were measured and evaluated in the same manner as in Example 1 except that a hard coat laminated film "REPTY DC100N" (trade name) manufactured by Riken Technos Co., Ltd. (total thickness: 250 μm, the (v) hardness value of a surface on which an organic-inorganic hybrid film was formed was 0.52 KN/mm$^2$) was used in place of the (C-1) as (C) a substrate, and applied electric power during film formation was changed to that in Example 3. The properties of the obtained laminate were as follows:

visible-light transmittance: 80%,
UV transmittance 1 (UV transmittance at a wavelength of 380 nm): 36%,
water contact angle: 116°,
UV transmittance 2 (UV transmittance at a wavelength range of from 300 to 380 nm): 8%, and
The value of the (v) hardness of the surface of the organic-inorganic hybrid film: 0.66 KN/mm$^2$.

Example 9

A laminate including an organic-inorganic hybrid film was produced, and the physical properties of the laminate were measured and evaluated in the same manner as in Example 1 except that a biaxially stretched polyethylene terephthalate film (total thickness: 250 μm, the (v) hardness value of a surface on which an organic-inorganic hybrid film was formed was 0.54 KN/mm$^2$) was used in place of the (C-1) as (C) a substrate, and applied electric power during film formation was changed to that in Example 3. The properties of the obtained laminate were as follows:

visible-light transmittance: 81%,
UV transmittance 1 (UV transmittance at a wavelength of 380 nm): 45%,
water contact angle: 121°,
UV transmittance 2 (UV transmittance at a wavelength range of from 300 nm to 380 nm): 23%, and
the (v) hardness value of the surface of the organic-inorganic hybrid film: 0.62 KN/mm$^2$.

According to Examples 8 and 9, it was confirmed that, even when the laminate was produced by forming the organic-inorganic hybrid film of the present invention on the surface of a resin film, a resin sheet, or a resin plate, the weather resistance and stain resistance of the resin film and the like could be largely improved, and the surface hardness and eventually the abrasion resistance could be largely improved.

REFERENCE SIGNS LIST

1 Sputtering chamber
2 Sputtering gas introduction port
3 Exhaust port
4 Cerium dioxide target
5 Polytetrafluoroethylene target
6 Sputtering table
7 Substrate
8 Target 4-side shutter
9 Target 5-side shutter

The invention claimed is:

1. An organic-inorganic hybrid film of a cerium oxide and an organic fluorine compound,
the organic-inorganic hybrid film satisfying the following (a), (b), and (c):
(a) a visible-light transmittance is 70% or higher;
(b) a UV transmittance at a wavelength of 380 nm is 60% or lower; and
(c) a water contact angle of a surface of the organic-inorganic hybrid film is 80° or higher,
wherein the thickness of the organic-inorganic hybrid film is 200 nm or less,
wherein the organic-inorganic hybrid film comprises cerium trifluoride, and
wherein the organic-inorganic hybrid film is produced by a sputtering method.

2. The organic-inorganic hybrid film according to claim 1, wherein the water contact angle of a surface of the organic-inorganic hybrid film is 90° or higher.

3. The organic-inorganic hybrid film according to claim 1, wherein the organic fluorine compound contains a fluorine-based resin.

4. A laminate comprising the organic-inorganic hybrid film according to claim 1.

5. The laminate according to claim 4, wherein the laminate has a UV transmittance at a wavelength of 300-380 nm is 30% or lower.

6. The laminate according to claim 4, wherein the laminate has a visible-light transmittance of 70% or higher.

7. An article comprising the organic-inorganic hybrid film according to claim 1.

8. The organic-inorganic hybrid film according to claim 1, wherein the organic fluorine compound comprises at least one selected from the group consisting of polytetrafluoroethylene and polyvinylidene fluoride.

9. The organic-inorganic hybrid film according to claim 1, wherein the cerium oxide contains a cerium dioxide.

10. The organic-inorganic hybrid film according to claim 1, wherein a ratio of a cerium compound having an oxidation number of +4 in the organic-inorganic hybrid film is 1 to 100 atomic %, in atomic ratio, when a sum of all cerium compounds is 100 atomic %.

11. The organic-inorganic hybrid film according to claim 1, wherein the thickness of the organic-inorganic hybrid film is 100 nm or less.

12. The organic-inorganic hybrid film according to claim 1, wherein the thickness of the organic-inorganic hybrid film is 50 nm or less.

13. The organic-inorganic hybrid film according to claim 1, wherein the sputtering method is selected from the group consisting of a bipolar sputtering method, a magnetron sputtering method, and a reactive sputtering method.

14. An organic-inorganic hybrid film of a cerium oxide and an organic fluorine compound,
   the organic-inorganic hybrid film satisfying the following (a), (b), and (c):
      (a) a visible-light transmittance is 70% or higher;
      (b) a UV transmittance at a wavelength of 380 nm is 60% or lower; and
      (c) a water contact angle of a surface of the organic-inorganic hybrid film is 80° or higher,
   wherein the thickness of the organic-inorganic hybrid film is 200 nm or less,
   wherein the ratio of atoms derived from the cerium oxide in the organic-inorganic hybrid film is 60 to 99.9 atomic %, when the sum of the atoms derived from the cerium oxide and the atoms derived from the organic fluorine compound is 100 atomic %, and
   wherein the organic-inorganic hybrid film is produced by a sputtering method.

* * * * *